(12) United States Patent
Bostick et al.

(10) Patent No.: US 9,756,744 B2
(45) Date of Patent: Sep. 5, 2017

(54) CONTROLLING RIGIDITY OF FLEXIBLE DISPLAYS

(71) Applicant: International Business Machines Corporation, Armonk, NY (US)

(72) Inventors: James E. Bostick, Cedar Park, TX (US); John M. Ganci, Jr., Cary, NC (US); Martin G. Keen, Cary, NC (US); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 14/645,761

(22) Filed: Mar. 12, 2015

(65) Prior Publication Data
US 2016/0270208 A1  Sep. 15, 2016

(51) Int. Cl.
*H05K 5/02* (2006.01)
*G06F 1/16* (2006.01)
*G09F 9/30* (2006.01)

(52) U.S. Cl.
CPC ......... *H05K 5/0217* (2013.01); *G06F 1/1652* (2013.01); *G09F 9/301* (2013.01)

(58) Field of Classification Search
CPC ....... H05K 1/028; H05K 1/181; H05K 5/0217
See application file for complete search history.

(56) References Cited

U.S. PATENT DOCUMENTS

| | | | |
|---|---|---|---|
| 7,180,665 B2 * | 2/2007 | Daniel | G06F 1/1601 160/373 |
| 8,764,255 B2 | 7/2014 | Hack et al. | |
| 9,058,758 B2 * | 6/2015 | Shin | G09G 3/3688 |
| 9,301,389 B2 * | 3/2016 | Yeo | H05K 1/0281 |
| 2013/0114193 A1 * | 5/2013 | Joo | F16M 11/08 361/679.01 |
| 2013/0155655 A1 * | 6/2013 | Lee | H05K 5/03 362/97.1 |

(Continued)

FOREIGN PATENT DOCUMENTS

WO       2014080176 A1    5/2014

OTHER PUBLICATIONS

Graham-Rowe, Duncan, "Flexible Screens Get Touchy-Feely", The first bendable, touch-screen display will be used by the military, MIT Technology Review, Feb. 27, 2009, <http://www.technologyreview.com/news/412322/flexible-screens-get-touchy-feely/>.

(Continued)

*Primary Examiner* — Hoa C Nguyen
*Assistant Examiner* — Keith Depew
(74) *Attorney, Agent, or Firm* — Erik K. Johnson

(57) ABSTRACT

Embodiments of the present invention provide methods and apparatuses that can control rigidity of a flexible display. Embodiments of the present invention enable a user of the flexible display to control rigidity of the flexible display based on user preference, sensing information, program instruction, or combinations thereof. Embodiments of the present invention provide several ways to control rigidity of the flexible display by manipulating one or more rigidity control members disposed on the flexible display. Accordingly, embodiments of the present invention provide a way to allow the flexible display to have varying rigidity throughout portions of the flexible display.

10 Claims, 8 Drawing Sheets

(56) References Cited

U.S. PATENT DOCUMENTS

| | | | | |
|---|---|---|---|---|
| 2015/0130775 A1* | 5/2015 | Kim | .................. | G06F 1/1652 |
| | | | | 345/205 |
| 2016/0132721 A1* | 5/2016 | Bostick | ................ | G06F 21/60 |
| | | | | 382/118 |
| 2016/0252236 A1* | 9/2016 | Chen | ................... | G02F 1/133 |
| 2016/0278246 A1* | 9/2016 | Yu | ................. | G02F 1/133308 |
| 2016/0295711 A1* | 10/2016 | Ryu | .................... | G09F 9/301 |
| 2016/0300513 A1* | 10/2016 | Ren | ....................... | G09F 9/00 |

OTHER PUBLICATIONS

Liggett, Brit, "Sony Unveils New Flexible E-Paper So Thin it Can Bend Around a Pencil", May 24, 2011, Inhabitat, <http://inhabitat.com/sony-unveils-new-flexible-e-paper-so-thin-it-can-bend-around-a-pencil/>.

Loveridge, Sam, "Apple patents flexible curved displays ahead of potential iWatch launch", Feb. 13, 2014, <http://www.trustedreviews.com/news/apple-patents-flexible-curved-displays-ahead-of-potential-iwatch-launch>.

"Biomechanics relevant to the musculoskeletal system", Biomechanics, Department of Orthopaedic Surgery—Stellenbosch University, provided by Inventor in Main Idea on Aug. 1, 2014, <http://www0.sun.ac.za/ortho/webct-ortho/physics/biomechanics.html>.

"Canadian researchers develop flexible phones", YouTube, Uploaded on May 5, 2011, <https://www.youtube.com/watch?v=TjU-V4kIt71>.

"Moment of Inertia of Composite Section Help for Bending—Transtutors", provided by Inventor in Main Idea dated Aug. 1, 2014, <http://www.transtutors.com/homework-help/mechanical-engineering/bending-stress/moment-of-inertia-of-composite-section.aspx>.

"Temporary bonding material enables flexible active components, photovoltaics", Renewable Energy®, World.Com, Dec. 2, 2011, <http://www.renewableenergyworld.com/rea/news/article/2011/12/temporary-bonding-material-enables-flexible-active-components-photovoltaics>.

* cited by examiner

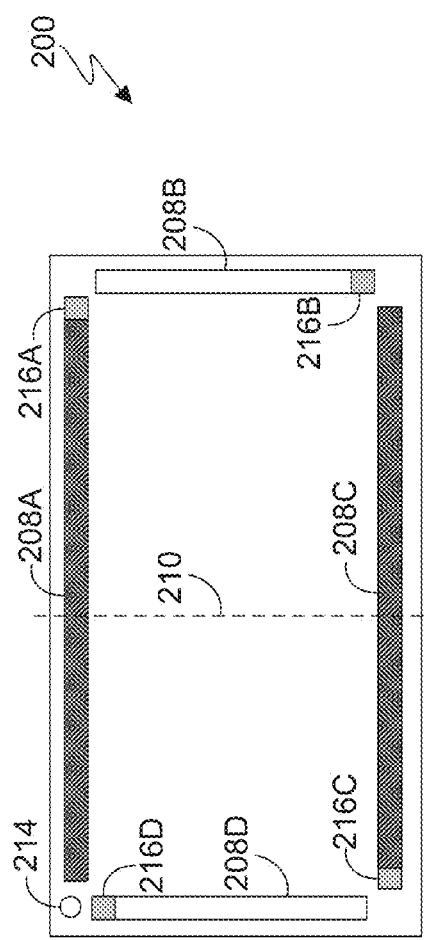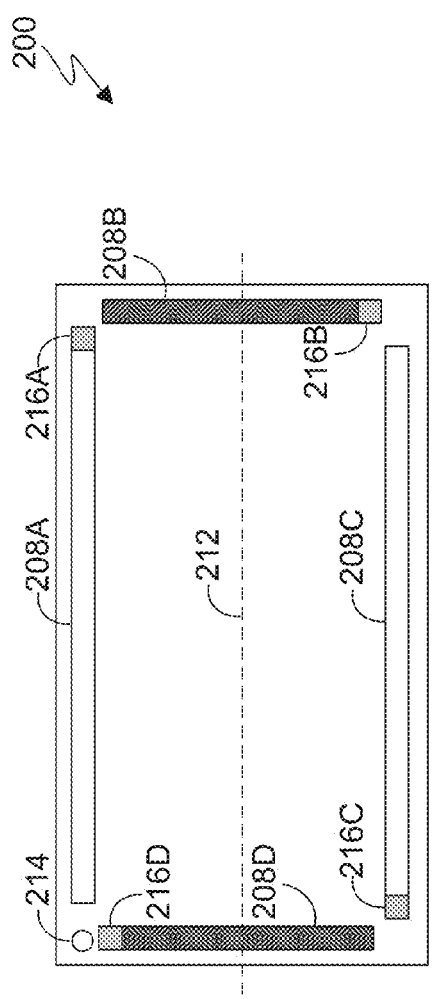

CONTROLLING RIGIDITY OF FLEXIBLE DISPLAYS

BACKGROUND OF THE INVENTION

The present invention relates generally to the field of flexible displays, and more particularly to controlling the rigidity of flexible displays.

Typically, electronic devices such as computer systems, cellular devices, and media players are provided with displays. Flexible display technologies can be implemented by electronic devices, but can result in over-bending of the electronic device. The user of the electronic device may desire a rigid display for certain applications and a flexible display for other applications. Providing a method to control the rigidity of flexible displays can offer users of electronic devices the ability to manipulate flexibility in flexible displays, in accordance with the user preferences.

SUMMARY

Embodiments of the present invention provide apparatuses, systems, and computer program products for controlling rigidity of a flexible display. In one embodiment, an apparatus for controlling rigidity of a flexible display is provided, comprising one or more rigidity control members coupled to a flexible display, wherein each of the one or more rigidity control members is configured to be individually activated or deactivated to modify rigidity of at least a portion of the flexible display.

BRIEF DESCRIPTION OF THE DRAWINGS

FIGS. 2A and 2B are diagrams illustrating configurations of rigidity control members for controlling the rigidity of one or more portions of a flexible display, in accordance with an embodiment of the present invention;

DETAILED DESCRIPTION

Embodiments of the present invention provide apparatuses and methods to control rigidity of a flexible display. Embodiments of the present invention provide one or more rigidity control members configured to be manipulated to control rigidity of the flexible display. In this manner, as discussed in greater detail in this specification, embodiments of the present invention can be used to manually, semi-automatically, or automatically activate rigidity control members of the flexible display to effectively control rigidity of the flexible display.

Figure 1A:
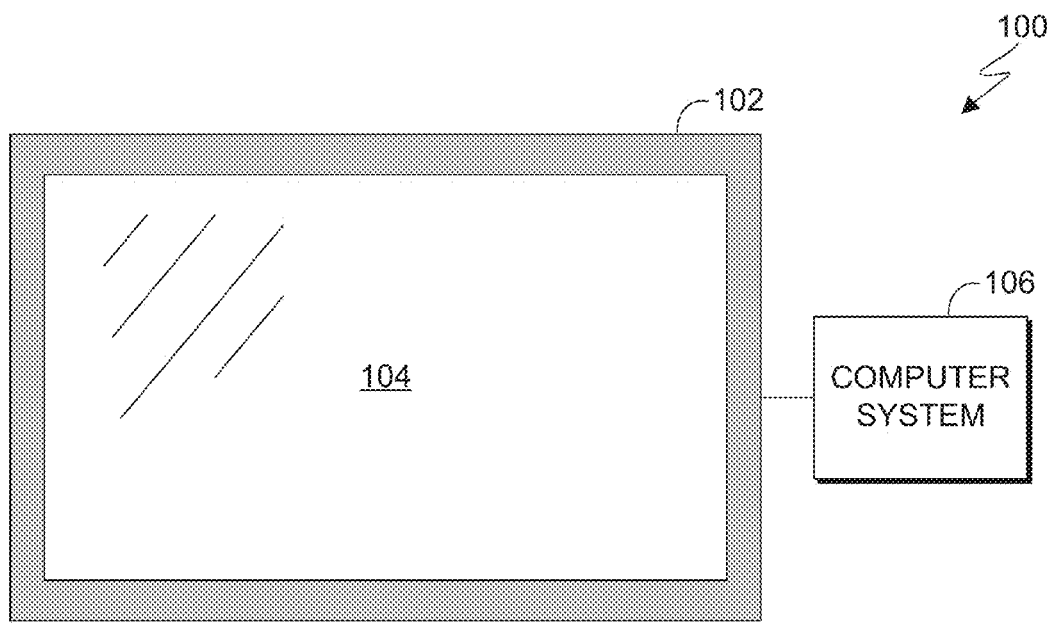
FIGS. 1A and 1B depict a flexible display, in accordance with an embodiment of the present invention.
Figure 1B:
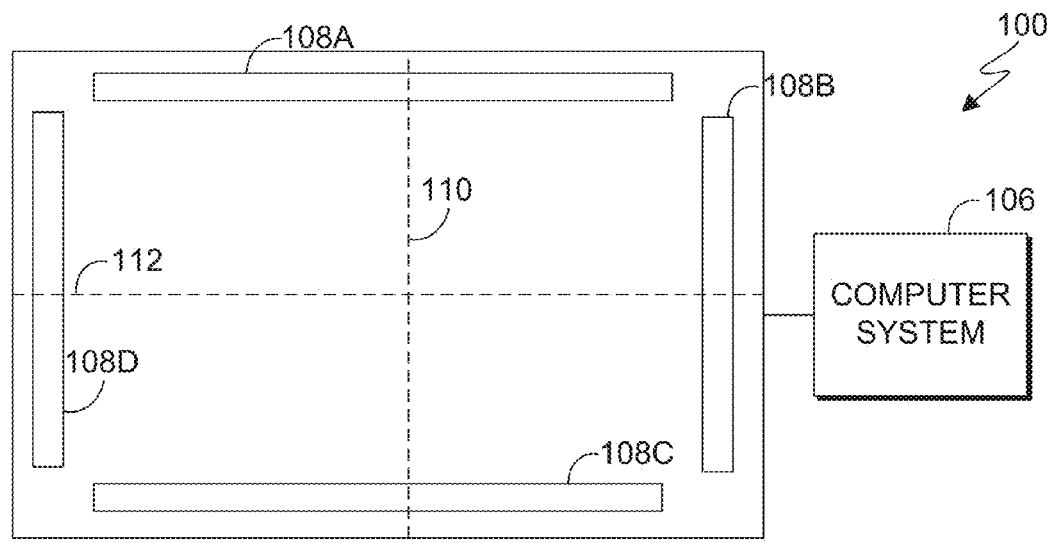

FIGS. 1A and 1B depict flexible display 100, in accordance with an embodiment of the present invention. FIG. 1A depicts a front facing view of flexible display 100. FIG. 1B depicts a back facing view of flexible display 100, comprising rigidity control members 108A-D. In this embodiment, flexible display 100 is a display for computer system 106. Computer system 106 can be can be a desktop computer, laptop computer, specialized computer server, or any other computer system known in the art, connected via one or more wired and/or wireless connections. Computer system 106 can also be integrated with display 104 and/or disposed within display 104. In general, computer system 106 of flexible display 100 is representative of any electronic device, or combination of electronic devices, capable of executing machine-readable program instructions, as described in greater detail with regard to FIG. 8.

Rigidity control members 108 include rigidity control members 108A, 108B, 108C, and 108D, and can be manipulated (i.e., activated or deactivated) to control rigidity of rigidity control members 108. In this embodiment, rigidity control members 108 are attached to flexible display 100, such that rigidity is imparted by rigidity control members 108A-D to those portions of flexible display 100 upon which rigidity control members 108A-D are disposed upon. Increasing rigidity of rigidity control members 108A and 108C resists bending of flexible display 100 about axis 110. In another example, increasing rigidity of rigidity control members 108B and 108D can increase rigidity of one or more portions of flexible display 100 when flexible display 100 is bent about axis 112. Accordingly, activating one or more rigidity control members 108A-D can prevent bending of one or more portions of flexible display 100.

In this embodiment, rigidity control members 110 are disposed on one or more portions of flexible display 100, such that rigidity control members 108A-D do not interfere with display functionality of flexible display 100 or other functions that flexible display 100 offers (e.g., touch screen functions, etc.). In this embodiment, rigidity control members 108 are coupled to a perimeter of flexible display 100. In other embodiments, although not depicted, rigidity control members 108A-D can be coupled to any portion of flexible display 100. For example, rigidity control members 108A-D can be disposed upon the center of flexible display 100.

Rigidity control members 108A-D can be coupled to one or more portions of flexible display 100 permanently (e.g., with permanent adhesive) and/or in a releasable fashion (e.g., with hook and loop fasteners, magnets, etc.). For example, a user of flexible display 100 may elect to temporarily modify positions of one or more rigidity control members 108A-D for increased or decreased control of the rigidity of flexible display 100. Accordingly, a greater or lesser number of rigidity control members 108A-D can be disposed on one or more portions of flexible display 100 to increase or decrease rigidity of one or more portions of flexible display 100, as described in greater detail with regard to FIG. 3. In this embodiment, a user of flexible display 100 manually activates or deactivates rigidity control members 108A, 108B, 108C, and/or 108D to control rigidity of flexible display 100. In another embodiment, a user of flexible display 100 indicates a desired change in rigidity, and subsequently, flexible display 100, and components therein, automatically activate or deactivate control members 108A, 108B, 108C, and/or 108D to control rigidity of flexible display 100. In yet another embodiment, flexible display 100, and components therein, automatically activate and deactivate control members 108A, 108B, 108C, and/or 108D to control rigidity of flexible display 100 without cooperation of a user of flexible display 100.

FIGS. 2A and 2B are diagrams illustrating configurations of rigidity control members for controlling the rigidity of one or more portions of flexible display 200, in accordance with an embodiment of the present invention. In this embodiment, different configurations of rigidity control members 208A-D offer different ways to control rigidity of one or more portions of flexible display 200. Furthermore, flexible display 200 implements sensors 214 and actuators 216A-D to semi-automatically and/or automatically manipulate rigidity control members 208A-D to control rigidity of one or more portions of flexible display 200.

In this embodiment, sensor 214 is disposed on flexible display 200 to detect conditions for which one or more portions of flexible display 200 should be modified. For example, flexible display 200 may use one or more sensors 214 to detect how a user of flexible display 200 is handling flexible display 200 (e.g., an orientation, viewing angle, etc.). In another example, flexible display 200 may use one or more sensors 214 to detect whether flexible display 200 is mishandled (e.g., bent) to a point of breakage. In this embodiment, sensor 214 is coupled to computer system 106 to provide information pertinent to detected conditions of flexible display 200. Subsequently, computer system 106 transmits instructions to one or more actuators 216A-D to activate or deactivate rigidity control members 208A-D.

In this embodiment, actuators 216A-D are coupled to flexible display 200 to semi-automatically and/or automatically manipulate respective rigidity control members 208A-D. Accordingly, one or more actuators 216A-D can control rigidity of one or more portions of flexible display 200 by one or more manipulating rigidity control members 208A-D. In this embodiment, actuators 216A-D can be an electro-mechanical device, configured to manipulate rigidity control members, as discussed in greater detail with regard to FIG. 7.

FIG. 2A is a diagram illustrating a first configuration of rigidity control members 208A-D. In this embodiment, rigidity control members 208A and 208C are manipulated (i.e., activated or deactivated) to control rigidity (i.e., allow or prevent bending about axis 210) of one or more portions flexible display 200, as discussed in greater detail with regard to FIG. 5A. Furthermore, actuators 216A and 216C can semi-automatically and/or automatically manipulate rigidity control members 208A and 208C, respectively.

FIG. 2B is a diagram illustrating a second configuration of rigidity control members 208A-D. In this embodiment, rigidity control members 208B and 208D are manipulated (i.e., activated or deactivated) to control rigidity (i.e., allow or prevent bending about axis 212) of one or more portions flexible display 200, as discussed in greater detail with regard to FIG. 5B. Furthermore, actuators 216B and 216D can semi-automatically and/or automatically manipulate rigidity control members 208B and 208D, respectively.

Figure 3:
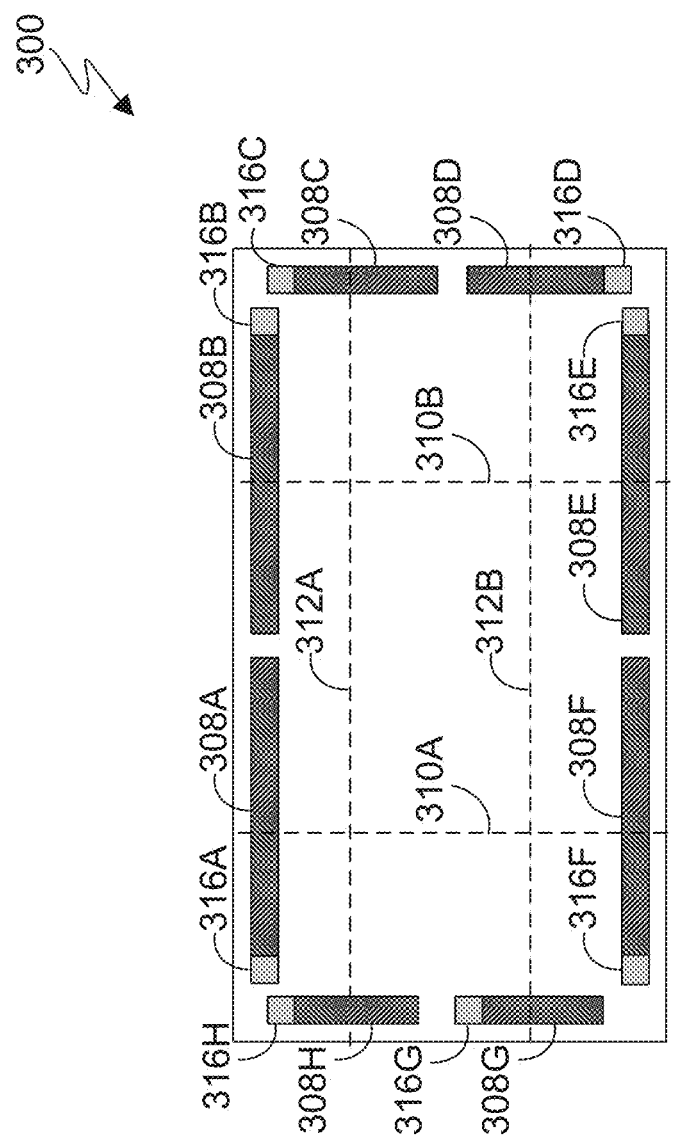
FIG. 3 depicts a configuration of rigidity control members for controlling the rigidity of one or more portions of a flexible display, in accordance with an embodiment of the present invention.

FIG. 3 depicts a configuration of rigidity control members for controlling the rigidity of one or more portions of flexible display 300, in accordance with an embodiment of the present invention. In this embodiment, rigidity control members 308A-H and actuators 316A-H are disposed on flexible display 300 to provide increased granularity for controlling rigidity of one or more portions of flexible display 300. For example, a user of flexible display 300 may require to only have an upper portion of flexible display 300 to be rigid (e.g., about axis 312A, 310 A, and 310B). In this instance, rigidity control members 308A, 308B, 308C, and 308H can be activated such that the upper portion of flexible display 300 is rigid (i.e., resists bending). Furthermore, actuators 316A, 316B, 316C, and 316H can semi-automatically and/or automatically manipulate rigidity control members 308A, 308B, 308C, and 308H, respectively. In this embodiment, axis 312A and axis 312B are normal to a length of flexible display 300. For example, the length of flexible display 300 may be the longest dimension of a side of flexible display 300. Furthermore, axis 310A bisects rigidity control members 308A and 308F; axis 310B bisects rigidity control members 308B and 308E; axis 312A bisects rigidity control members 308C and 308H; and axis 312B bisects rigidity control members 308B and 308D. In other embodiments, axis 310A-B and/or axis 312B may be oriented in any direction such that axes 310A-B and/or axes 312A-B intersect rigidity control members 110 at any point. For example, axes 310A-B and/or axes 312A-B may be diagonal lines. It should be understood, for illustrative purposes, a greater or lesser number of axes 310A-B and axes 312A-B can be disposed on flexible display 300 and can vary based at least in part on a number and location of rigidity control members 308A-H.

Figure 4A:
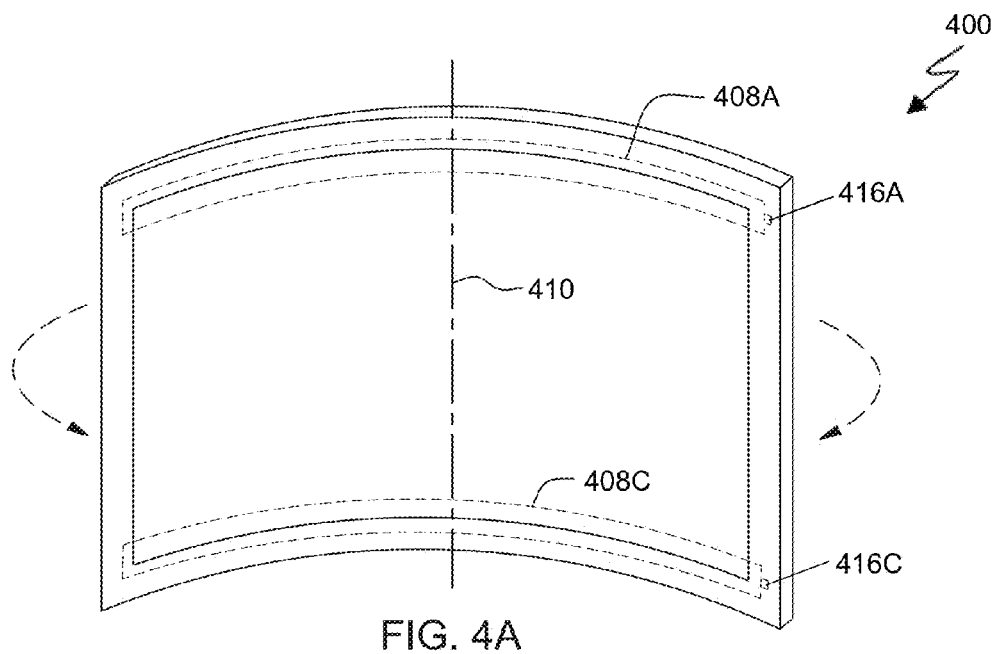
FIGS. 4A and 4B depict one or more portions of a flexible display bent around an axis, in accordance with an embodiment of the present invention.
Figure 4B:
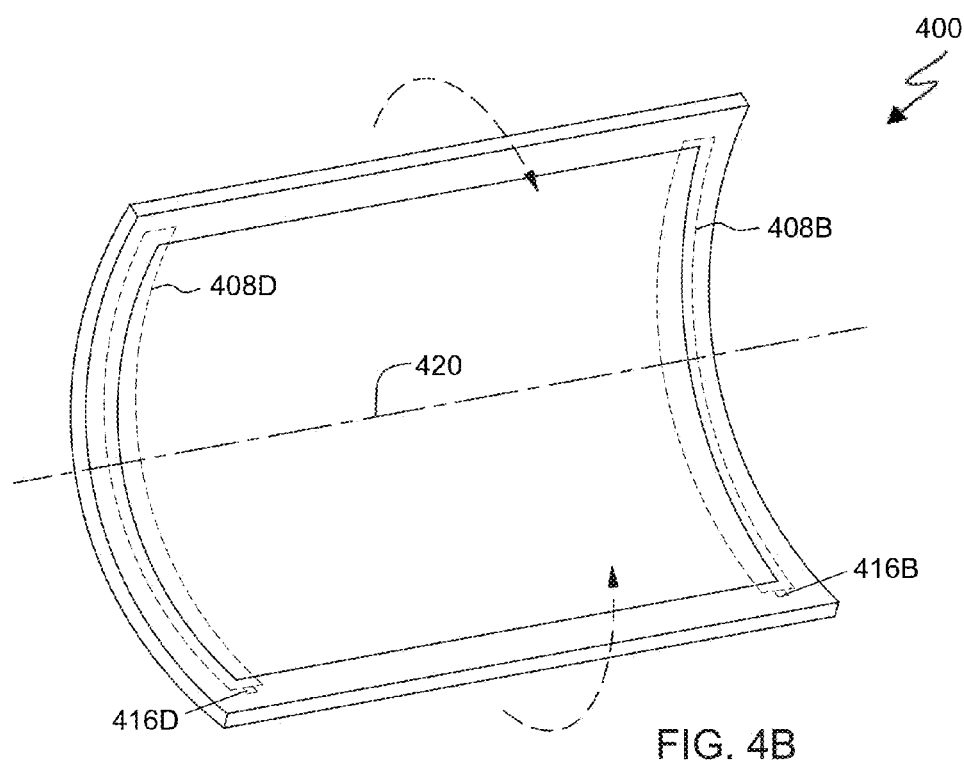

FIGS. 4A and 4B are diagrams of one or more portions of flexible display 400 bent around an axis, in accordance with an embodiment of the present invention. In this embodiment, flexible display 400 comprises rigidity control members 408A, 408B, 408C, and 408D. Furthermore, one or more forces can be applied to one or more portions (e.g., sides) of flexible display 400 causing flexible display 400 to bend about one or more axes. For illustrative purposes, the forces depicted herein result in static deformation of flexible display 400 and are applied equally on opposite sides of flexible display 400. It should be understood that additional forces may be applied to one or more portions of flexible display 400, resulting in bending in a manner not depicted in FIGS. 4A and 4B. Accordingly, activating rigidity control members 408A-D increases rigidity of one or more portions of flexible display 400 and prevents bending of flexible display 400.

FIG. 4A is a diagram illustrating two forces applied to two opposite sides of flexible display 400. As shown, rigidity control members 408A and 408C are not activated and, as a result, the two forces applied to the two sides of flexible display 400 bend flexible display 400 about axis 410, are depicted by dashed arrows. Rigidity control members 408A and 408C can be activated and, as a result, the two forces applied to the two sides of flexible display 400 do not bend flexible display 400 about axis 410 (or bend to a lesser extent). In another embodiment, the two forces applied onto flexible display 400 may result in an unsafe condition, and the unsafe condition can be detected by one or more sensors (e.g., sensors 214). Furthermore, the one or more sensors can provide information to a computer system (e.g., computer system 106) indicating that one or more portions of flexible display 400 require control of rigidity. Accordingly, the computer system instructs actuators 416A and 416C to manipulate (i.e., activate) rigidity control members 408A and 408C, respectively, to prevent the two forces from causing flexible display 400 to bend about axis 410 (or bend to a lesser extent). Rigidity control members 408A and 408C can be manipulated in accordance with operational steps described in FIG. 7.

FIG. 4B is a diagram illustrating two forces applied to two opposite sides of flexible display 400. As shown, rigidity control members 408B and 408D are not activated and, as a result, the two forces applied to the two sides of flexible display 400 bend flexible display 400 about axis 420. Rigidity control members 408B and 408D are activated and, as a result, the two forces applied to the two sides of flexible display 400 do not bend flexible display 400 about axis 420 (or bend to a lesser extent). As previously discussed, one or more sensors can detect an unsafe condition and provide an indication that one or more portions of flexible display 400 require control of rigidity, upon which actuators 416B and 416D can be activated to manipulate rigidity control members 408B and 408D, respectively.

Figure 5A:
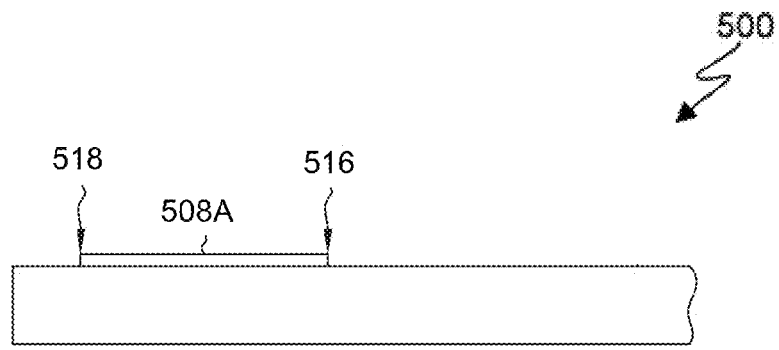
FIGS. 5A-5C depict a rigidity control member in different configurations, in accordance with an embodiment of the present invention.
Figure 5B:
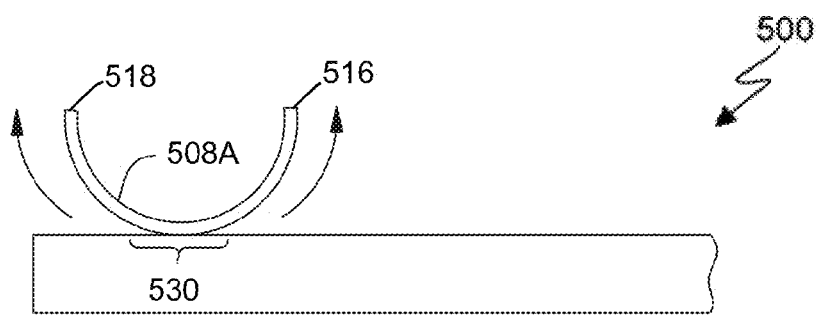
Figure 5C:
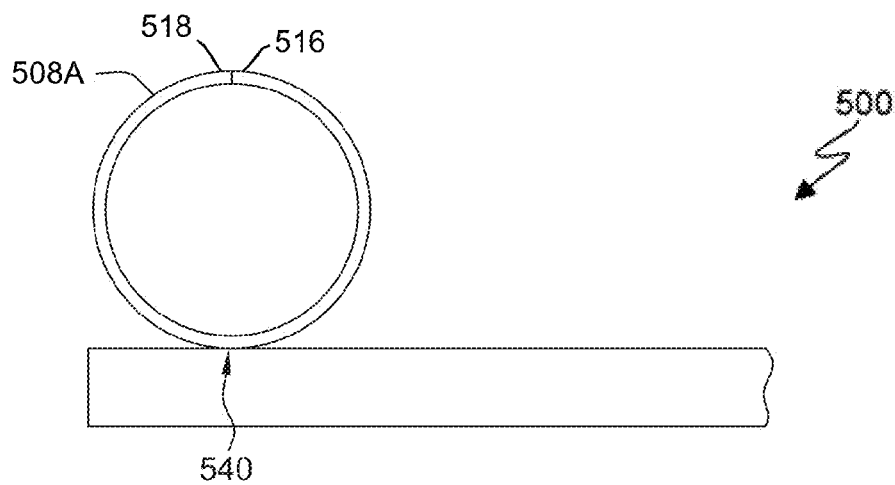

FIGS. 5A-5C depict rigidity control member 508A in different configurations of flexible display 500, in accordance with an embodiment of the present invention. In this embodiment, rigidity control member 508A is manipulated by a user of flexible display 500. In another embodiment, one or more actuators (e.g., actuators 216) semi-automatically and/or automatically manipulate rigidity control member 508A, in accordance with operational steps described in FIG. 7. In this embodiment, rigidity control member 508 comprises one or more materials that are capable of being activated (e.g., rolled, folded, etc.) to increase rigidity of one or more portions of flexible display 500.

FIG. 5A depicts rigidity control member 508A in a fully deactivated configuration. In this embodiment, end 516 and end 518 of rigidity control member 508A are manipulated such that rigidity control member 508A is in contact with flexible display 500. In this embodiment, a deactivated configuration results in a small moment of inertia. In this configuration, rigidity control member 508A provides little to no resistance to bending about an axis normal to a length of rigidity control member 508A (see FIG. 2, axis 210 relative to rigidity control members 208A and 208C) if one or more forces are exerted onto flexible display 500.

FIG. 5B depicts rigidity control member 508A in an activated configuration. In this embodiment, end 516 and end 518 of rigidity control member 508A are manipulated away from flexible display 500, such that only portion 530 of rigidity control member 508A is in contact with a portion of flexible display 500. Portion 530 comprises a surface area less than the surface area of rigidity control member 508A in a fully deactivated configuration, as shown in FIG. 5A. In this embodiment, activating control member 508A increases a moment of inertia of one or more portions of flexible display 500. Accordingly, rigidity control member 508A provides partial resistance to bending about an axis normal to a length of rigidity control member 508A (see FIG. 2, axis 210) if one or more forces are exerted onto flexible display 500.

FIG. 5C depicts rigidity control member 508A in another activated configuration. In this embodiment, end 516 and end 518 of rigidity control member 508A are manipulated further away from flexible display 500, such that only portion 540 of rigidity control member 508A is in contact with a portion of flexible display 500. Portion 540 comprises a surface area less than the surface area of portion 530 of rigidity control member 508A, as shown in FIG. 5B. In this embodiment, an activated configuration of rigidity control member 508A results in a greater moment of inertia of one or more portions of flexible display 500. Accordingly, rigidity control member 508A provides resistance to bending about an axis normal to a length of rigidity control member 508A (see FIG. 2, axis 210) if one or more forces are exerted onto flexible display 500.

A user of flexible display 500, or the one more actuators, can control movement of ends 516 and 518 by rotating ends 516 and 518 about a point of attachment between rigidity control member 508A and a portion of flexible display 500. In other embodiment, the user of flexible display 500, or the one more actuators, can control movement of ends 516 and 518 by rotating ends 516 and 518, such that ends 516 and 518 are overlapping one another in a spiral fashion. In general, rigidity control member 508A can be manipulated in any fashion to increase the moment of inertia imparted on the portion of flexible display 500.

Figure 6:
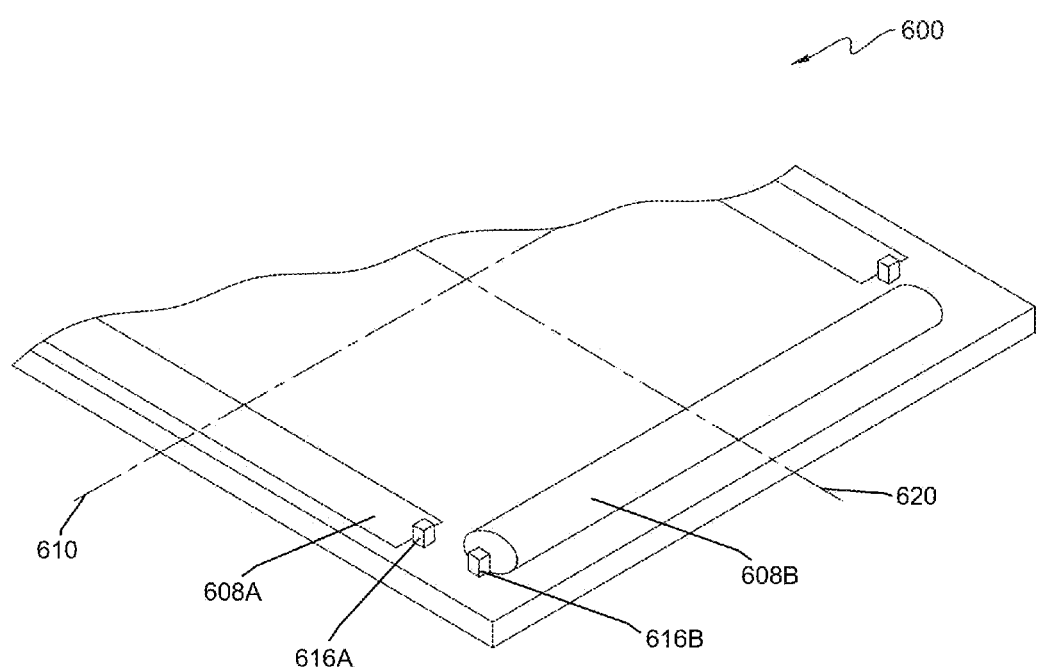
FIG. 6 illustrates a flexible display having two types of rigidity control members, in accordance with an embodiment of the present invention.

FIG. 6 illustrates flexible display 600 having two types of rigidity control members, in accordance with an embodiment of the present invention. In this embodiment, rigidity control members 608A and 608B are activated to increase the rigidity of portions of flexible display 600. Rigidity control members 608A and 608B are disposed on one or more portions of flexible display 600 to prevent bending about axis 610 and axis 620. Although not depicted, additional rigidity control members 608A and 608B may be disposed on portions of flexible display 600 that are not along a perimeter of flexible display 600 to increase control of rigidity of flexible display 600.

In this embodiment, rigidity control members 608A and 608B comprise one or more materials to be manipulated (i.e., rolled, unrolled, inflated, and/or deflated) to control rigidity of flexible display 600. In this embodiment, a user of flexible display 600 activates (i.e., rolls) the one or more materials of rigidity control member 608A to increase the rigidity of the portion of flexible display 600 which rigidity control member 608A is disposed upon. In another embodiment, actuators 616A and 616B may activate the one or more materials of rigidity control members 608A and 608B automatically and/or semi-automatically (e.g., motors, etc.).

The one or more actuators activate (i.e., inflates) a bladder of rigidity control member 608B to increase the rigidity of the portion of flexible display 100. For example, the one or more actuators can comprise a pumping device that can pump fluid (e.g., gas or liquid) into the bladder of strip component 608B. Furthermore, the one or more actuators can deactivate (i.e., deflate) the bladder of rigidity control member 608B to decrease rigidity of the portion of flexible display 600. As previously discussed, the one or more actuators can inflate the bladder of rigidity control member 608B to a lesser extent to provide partial resistance to bending of flexible display 600 about axis 620. For illustrative purposes, it should be understood that, instead of the one or more actuators activating or deactivating (i.e., inflating or deflating) rigidity control member 608B or a user of flexible display 600 may manually manipulate rigidity control member 608B.

Figure 7:
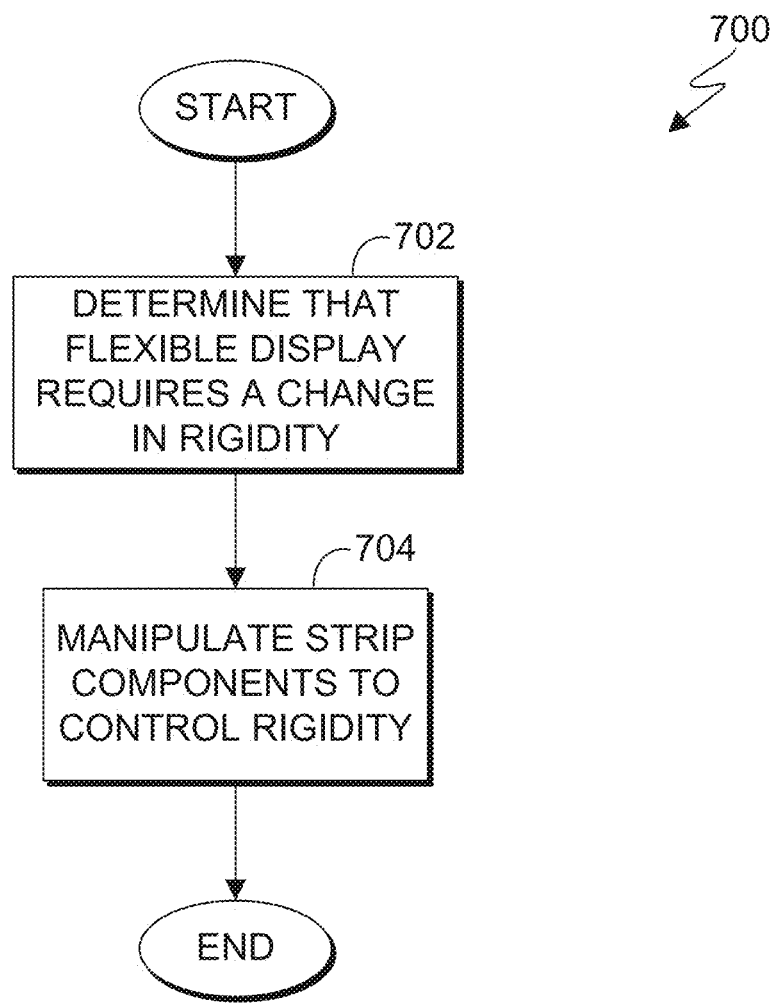
FIG. 7 is a flowchart illustrating operational steps for controlling rigidity of a flexible display, in accordance with an embodiment of the present invention.

FIG. 7 is flowchart 700 illustrating operational steps for controlling rigidity of flexible display 200 of FIG. 2, in accordance with an embodiment of the present invention. In this embodiment, rigidity control members 208A-D are manipulated manually, semi-automatically, and/or automatically to control rigidity of one or more portions of flexible display 200.

In step 702, computer system 106 determines that one or more portions of flexible display 200 require a change in rigidity. In this embodiment, computer system 106 uses information from a user of flexible display 200, one or more sensors (e.g., sensor 214), and input from a program of flexible display 200, or combinations thereof. For example, the user of flexible display 200 may prefer to use flexible display 200 as a temporary rigid display. In this instance, the user of flexible display 200 will provide computer system 106 with information indicating that one or more portions of flexible display 200 require a change in rigidity (e.g., clicking a button or sliding a switch). In another embodiment, a user of flexible display 200 can determine that one or more portions of flexible display 200 require a change in rigidity (i.e., a manual determination to change rigidity of one or more portions of flexible display 200 can be made by a user of flexible display 200). In another embodiment, the one or more sensors can provide computer system 106 with information pertinent to conditions of flexible display 200, as previously discussed. For example, a user of flexible display 100 may improperly handle flexible display 200, and the one or more sensors can provide information to computer system 106 indicating that one or more portions of flexible display 200 require a change in rigidity to prevent over-bending. In another embodiment, a program of flexible display 200 may require a to change in rigidity of one or more portions of flexible display 200. For example, a program of flexible display 200 may be a video game requiring a temporary rigid display.

Information provided to computer system 106 may specify to have no rigidity in one or more portions of flexible display 200 (i.e., deactivated rigidity control members 208A-D, resulting in a completely flexible display with no resistance to bending), to have partial rigidity in one or more portions of flexible display 200 (i.e., activating fewer rigidity control members 208A-D and/or activating rigidity control members 208A-D to a lesser extent, resulting in a partially flexible display with little resistance to bending), and/or complete rigidity in one or more portions of flexible display 200 (i.e., activating more rigidity control members 208A-D and/or activating rigidity control members 208A-D to a greater extent, resulting in a rigid display with increased resistance to bending). In this embodiment, computer system 106 identifies one or more rigidity control members 208A-D to be manipulated that are coupled to the one or more portions of flexible display 200 requiring a change in rigidity. It should be understood that, in another embodiment, computer system 106 may not provide information indicating that one or more portions of flexible display 200 require a change in rigidity. For example, a user of flexible display 200 can manually determine that one or more portions of flexible display 200 should be subjected to a change in rigidity.

In step 704, computer system 106 instructs one or more actuators (e.g., actuators 216A-D) to manipulate one or more rigidity control members 208A-D to control rigidity of one or more portions of flexible display 200. In this embodiment, the one or more actuators control rigidity of the one or more portions of flexible display 200 to which the one or more rigidity control members 208A-D are coupled. In other words, the one or more portions of flexible display 200 identified in step 702 undergo a change in rigidity by manipulating the one or more rigidity control members 208A-D. In another embodiment, the one or more actuators are not disposed on flexible display 200. Instead, a user of flexible display 200 manipulates one or more rigidity control members 208A-D to control rigidity of one or more portions of flexible display 200 (e.g., manually rolling and/or inflating rigidity control members 208A-D). In yet another embodiment, one or more actuators 216A-D are instructed to manipulate one or more rigidity control members 208A-D by a user of flexible display 200. Accordingly, rigidity of one or more portions of flexible display 200 can be controlled manually (i.e., manipulating rigidity control members 208A-D without implementation of actuators 216A-D and computer system 106), semi-automatically (i.e., a user instructs actuators 216A-D to manipulate rigidity control members 208A-D, or a user instructs computer system 106 to manipulate rigidity control members 208A-D), and/or automatically (i.e., computer system 106 automatically instructs actuators 216A-D to manipulate rigidity control members 208A-D based on information, as previously discussed). Furthermore, activating or deactivating (i.e., manipulating) rigidity control members 208A-D can be accomplished through multiple ways, as previously discussed. For example, ends of rigidity control members 208A-D can be controlled to increase or decrease rigidity in one or more portions of flexible display 200. In another example, rigidity control members 208A-D may be inflated with a fluid (e.g., air) to control rigidity of flexible display 200.

Figure 8:
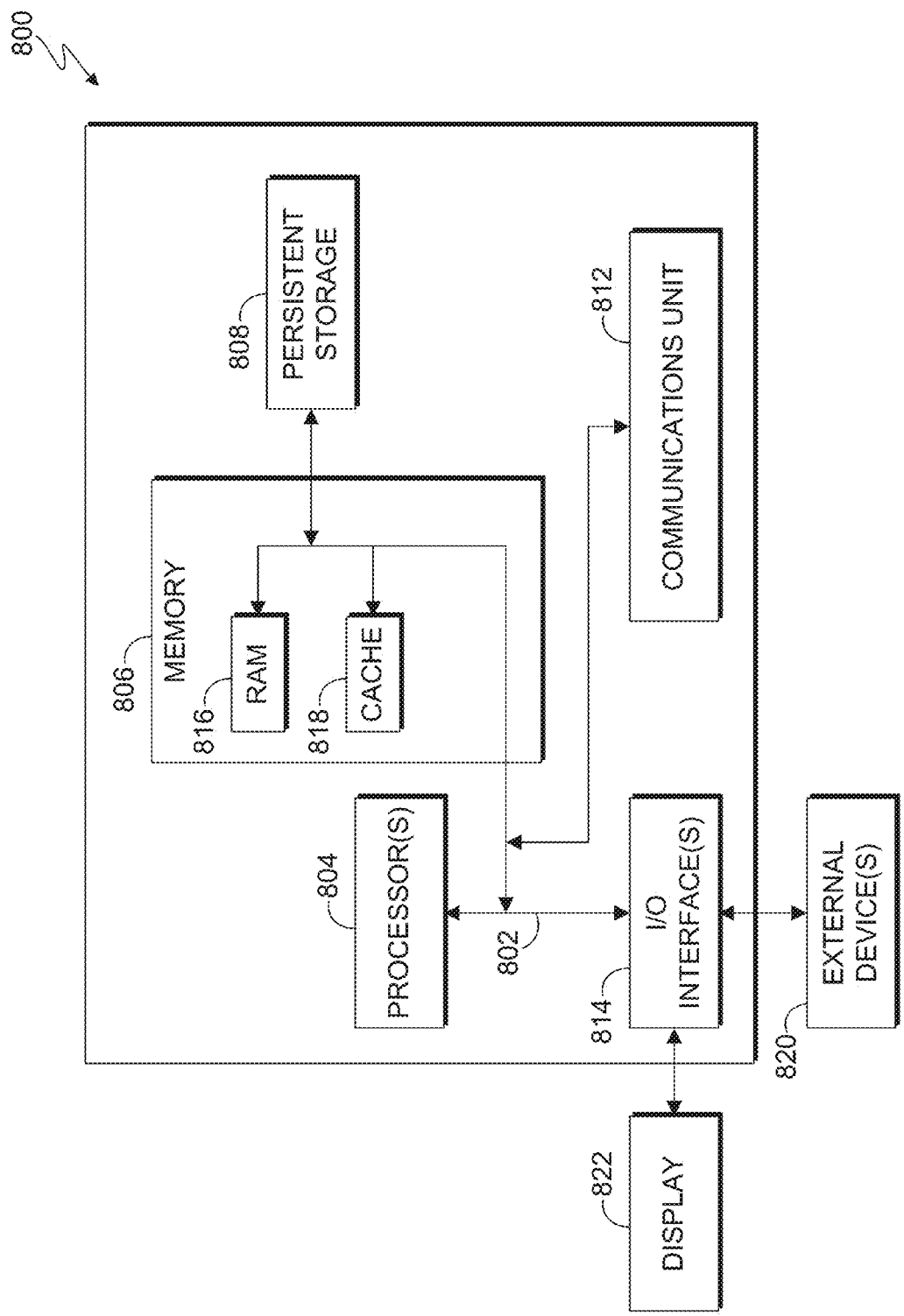
FIG. 8 is a block diagram of internal and external components of a computer system, in accordance with an embodiment of the present invention.

FIG. 8 is a block diagram of internal and external components of a computer system 800, which is representative the computer systems of FIG. 1 (e.g., computer system 106), in accordance with an embodiment of the present invention. It should be appreciated that FIG. 8 provides only an illustration of one implementation and does not imply any limitations with regard to the environments in which different embodiments may be implemented. In general, the components illustrated in FIG. 8 are representative of any electronic device capable of executing machine-readable program instructions. Examples of computer systems, environments, and/or configurations that may be represented by the components illustrated in FIG. 8 include, but are not limited to, personal computer systems, server computer systems, thin clients, thick clients, laptop computer systems, tablet computer systems, cellular telephones (e.g., smart phones), multiprocessor systems, microprocessor-based systems, network PCs, minicomputer systems, mainframe computer systems, and distributed cloud computing environments that include any of the above systems or devices.

Computer system 800 includes communications fabric 802, which provides for communications between one or more processors 804, memory 806, persistent storage 808, communications unit 812, and one or more input/output (I/O) interfaces 814. Communications fabric 802 can be implemented with any architecture designed for passing data and/or control information between processors (such as microprocessors, communications and network processors, etc.), system memory, peripheral devices, and any other hardware components within a system. For example, communications fabric 802 can be implemented with one or more buses.

Memory 806 and persistent storage 808 are computer-readable storage media. In this embodiment, memory 806 includes random access memory (RAM) 816 and cache memory 818. In general, memory 806 can include any suitable volatile or non-volatile computer-readable storage media. Software is stored in persistent storage 808 for execution and/or access by one or more of the respective processors 804 via one or more memories of memory 806.

Persistent storage 808 may include, for example, a plurality of magnetic hard disk drives. Alternatively, or in addition to magnetic hard disk drives, persistent storage 808 can include one or more solid state hard drives, semiconductor storage devices, read-only memories (ROM), erasable programmable read-only memories (EPROM), flash memories, or any other computer-readable storage media that is capable of storing program instructions or digital information.

The media used by persistent storage 808 can also be removable. For example, a removable hard drive can be used for persistent storage 808. Other examples include optical and magnetic disks, thumb drives, and smart cards that are inserted into a drive for transfer onto another computer-readable storage medium that is also part of persistent storage 808.

Communications unit 812 provides for communications with other computer systems or devices via a network. In this exemplary embodiment, communications unit 812 includes network adapters or interfaces such as a TCP/IP adapter cards, wireless Wi-Fi interface cards, or 3G or 4G wireless interface cards or other wired or wireless communication links. The network can comprise, for example, copper wires, optical fibers, wireless transmission, routers, firewalls, switches, gateway computers and/or edge servers. Software and data used to practice embodiments of the present invention can be downloaded to the computer system through communications unit 812 (e.g., via the Internet, a local area network or other wide area network). From communications unit 812, the software and data can be loaded onto persistent storage 808.

One or more I/O interfaces 814 allow for input and output of data with other devices that may be connected to computer system 800. For example, I/O interface 814 can provide a connection to one or more external devices 820 such as a keyboard, computer mouse, touch screen, virtual keyboard, touch pad, pointing device, or other human interface devices. External devices 820 can also include portable computer-readable storage media such as, for example, thumb drives, portable optical or magnetic disks, and memory cards. I/O interface 814 also connects to display 822.

Display 822 provides a mechanism to display data to a user and can be, for example, a computer monitor. Display 822 can also be an incorporated display and may function as a touch screen, such as a built-in display of a tablet computer.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus for controlling rigidity of a flexible display, the apparatus comprising:
   one or more rigidity control members coupled to a flexible display, wherein each of the one or more rigidity control members is configured to be individually activated or deactivated to modify rigidity of at least a portion of the flexible display;
   wherein a first portion of each of the one or more rigidity control members is coupled to the flexible display at a point of attachment;
   wherein a second portion of each of the one or more rigidity control members moves about the point of attachment to provide resistance to bending about an axis that is normal to a length of each of the one or more rigidity control members;
   wherein activating the one or more rigidity control members comprises moving the second portion to decrease a contact surface area between the one or more rigidity control members and the corresponding portion of the flexible display; and
   wherein deactivating the one or more rigidity control members comprises moving the second portion to increase the contact surface area between the one or more rigidity control members and the corresponding portion of the flexible display.

2. The apparatus of claim 1, further comprising:
   one or more sensors coupled to each of the one or more rigidity control members, wherein each of the one or more sensors is configured to obtain sensing information describing bending or orientation of the flexible display.

3. The apparatus of claim 1, further comprising:
   one or more actuators coupled to each of the one or more rigidity control members, wherein each of the one or more actuators is configured to activate or deactivate the one or more rigidity control members to which it is coupled to modify rigidity of at least a portion of the flexible display.

4. The apparatus of claim 3, further comprising:
   a computer system coupled to the flexible display and each of the one or more actuators, wherein the computer system is configured to determine whether to modify rigidity of at least a portion of the flexible display, and to instruct the one or more actuators to manipulate one or more rigidity control members.

5. The apparatus of claim 4, wherein the computer system is configured to determine whether to modify rigidity of one or more portions of the flexible display, based on an orientation of the flexible display.

6. The apparatus of claim 4, wherein the computer system is configured to determine whether to modify rigidity of one or more portions of the flexible display, based on a breaking point of the flexible display.

7. The apparatus of claim 3, wherein a first actuator is configured to activate a first rigidity control member by rotating edges of the first rigidity control member to increase resistance to bending of the first rigidity control member.

8. The apparatus of claim 7, wherein rotating edges of the first rigidity control member increases resistance to bending along an axis perpendicular to a length of the first rigidity control member.

9. The apparatus of claim 3, wherein a first actuator is configured to activate a first rigidity control member by controlling flow of fluid into the first rigidity control member to increase resistance to bending of the first rigidity control member.

10. The apparatus of claim 1, wherein each of the one or more rigidity control members is disposed along a perimeter of the flexible display to prevent bending about an axis that is perpendicular to a length of each of the one or more rigidity control members.

* * * * *